United States Patent

Shinohara et al.

[11] Patent Number: 5,755,278
[45] Date of Patent: May 26, 1998

[54] HEAT SINK ATTACHED TO A HEAT PLATE

[75] Inventors: Tatsuo Shinohara; Makoto Takeshita, both of Minamitsuru, Japan

[73] Assignee: Fanuc, Ltd., Yamanashi, Japan

[21] Appl. No.: 799,185

[22] Filed: Feb. 12, 1997

Related U.S. Application Data

[63] Continuation of Ser. No. 491,903, Sep. 29, 1995, abandoned.

[30] Foreign Application Priority Data

Dec. 8, 1993  [JP]  Japan ................. 5-308090

[51] Int. Cl.⁶ ................. F28D 15/02; H05K 7/20
[52] U.S. Cl. ................. 165/104.33; 174/15.2; 257/715; 361/700
[58] Field of Search ................. 165/80.3, 104.21, 165/104.33, 185; 174/15.2; 257/715; 361/699, 700

[56] References Cited

U.S. PATENT DOCUMENTS

| | | | |
|---|---|---|---|
| 3,035,419 | 5/1962 | Wigert | 165/104.33 |
| 3,209,062 | 9/1965 | Scholz | 165/170 X |
| 3,226,602 | 12/1965 | Elfving | 361/700 |
| 3,412,566 | 11/1968 | Townsend et al. | 165/80.3 |
| 3,476,177 | 11/1969 | Potzl | 165/80.3 |
| 3,971,435 | 7/1976 | Peck | 165/104.26 X |
| 4,414,604 | 11/1983 | Matsui et al. | 174/15.2 X |
| 4,830,100 | 5/1989 | Kato et al. | 165/104.33 X |
| 5,155,661 | 10/1992 | Nagesh et al. | 165/80.3 X |
| 5,283,715 | 2/1994 | Carlsten et al. | 165/104.33 X |
| 5,343,940 | 9/1994 | Jean | 165/104.33 |

FOREIGN PATENT DOCUMENTS

| | | | |
|---|---|---|---|
| 1284506 | 12/1968 | Germany | 361/700 |
| 63-200347 | 12/1988 | Japan . | |
| 1-157491 | 10/1989 | Japan . | |
| 2-110296 | 4/1990 | Japan . | |
| 2-54065 | 4/1990 | Japan . | |
| 6-85480 | 3/1994 | Japan . | |

*Primary Examiner*—Leonard R. Leo
*Attorney, Agent, or Firm*—Staas & Halsey

[57] ABSTRACT

A heat sink attached to a heat plate comprising a heat plate (1) produced by sticking two aluminum plates (11, 12) to each other, leaving a closed path (13) therebetween for confining a heat exchange medium therein, and of which the bottom is attached by an object to be cooled, a cooling fin (2) which is stuck to the upper region of the heat plate (1), and a flange (4) for mounting the assembly of the heat plate (1) and the cooling fin 92), wherein the surface of the heat plate (1) on which the cooling fin (2) is to be attached, is even and the cooling fin (2) and the flange (4) are a one-piece structure fabricated by employing die casting.

2 Claims, 5 Drawing Sheets

HEAT SINK ATTACHED TO A HEAT PLATE

This application is a continuation of application Ser. No. 08/491,903, filed Sep. 29, 1995, now abandoned.

FIELD OF THE INVENTION

This invention relates to an improvement applicable to a heat sink attached to a heat plate. More specifically, this invention relates to an improvement developed for decreasing the production cost of a heat sink attached to a heat plate by decreasing number of the parts to be employed for production thereof, and by enabling the production thereof without employing an aluminum soldering process.

BACKGROUND OF THE INVENTION

A heat sink attached to a heat plate is available in the prior art. A heat plate is defined as a small sized vertical type heat exchanger produced by sticking two aluminum plates with an adhesive, together leaving a closed path for allowing a medium for heat exchange, such as Freon or the like, to flow therein. When employed, a heat plate is placed in the vertical position to allow the heat exchange medium, such as Freon, to circulate in the vertical direction within the closed path, to allow heat exchange to occur between the gas of the heat exchange medium, which is inclined to go upward, and the liquid of the heat exchange medium, which is inclined to go downward. In this manner, a heat plate transmits heat from an object to be cooled, which is attached to the bottom of the heat plate, toward a cooling fin etc., which is attached to the top of the heat plate, to radiate the heat therefrom.

FIG. 1 illustrates a broken perspective view of a heat sink attached to a heat plate, available in the prior art, and FIG. 2 illustrates an assembled perspective view of a heat sink attached to a heat plate, available in the prior art. Referring to FIGS. 1 and 2, a heat sink attached to a heat plate available in the prior art consists of a heat plate 1, a cooling fin 21 produced by employing an aluminum extrusion process, a heat transmission plate 31 with which an object to be cooled 5 is attached to the heat plate 1, and of which the object is improvement of heat transmission efficiency between an object to be cooled 5 and the heat plate 1, and a flange 41, produced by employing an aluminum die casting process, and which is employed to mount the heat sink on a cubicle etc., which is employed for mounting electrical equipment or the like. Since the surface of the heat plate 1 is not even due to the closed path for a heat exchange medium between the two aluminum plates, employment of an aluminum soldering process is essential to stick a cooling fin 21 on the heat plate 1.

As was described above, the production of a heat sink attached to a heat plate available in the prior art requires a large number of parts and employment of an aluminum soldering process. Therefore, the heat sink attached to a heat plate available in the prior art has the drawback in that its fabrication is long and complicated, resulting in high production cost.

The object of this invention is to provide a heat sink attached to a heat plate which requires a small number of parts to be employed for fabrication thereof, and which requires a short and simple process for fabrication thereof, and which does not require employment of an aluminum soldering process. Accordingly, only a short and simple process for fabrication thereof is required at a lower production cost.

DISCLOSURE OF THE INVENTION

According to this invention, there is provided a heat sink attached to a heat plate comprising: a heat plate (1) which is produced by sticking two aluminum plates (11 and 12) to each other, leaving a closed path (13) therebetween for allowing a heat exchange medium to be confined therein and to circulate therein, in the vertical direction, and of which the bottom is attached to an object to be cooled, a cooling fin (2) which is stuck to at least the upper region of one surface of the heat plate (1), and a flange (4) which is employed for mounting the assembly of the heat plate (1) and the cooling fin (2), wherein: the surface of the heat plate (1) on which the cooling fin (2) is to be attached, is even, and the cooling fin (2) and the flange (4) are fabricated in one body by employing a die casting process.

DETAILED DESCRIPTION OF PREFERRED EMBODIMENT

Figure 1:
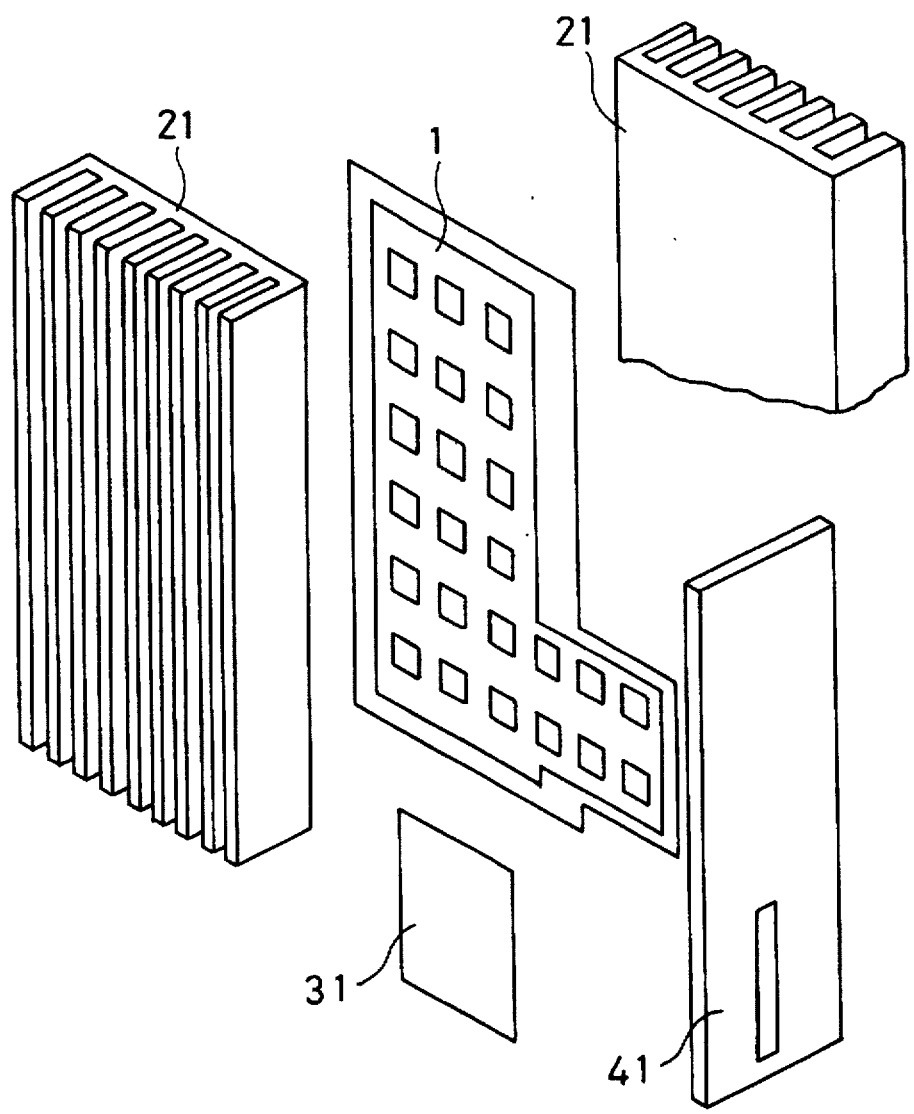
FIG. 1 is a broken perspective view of a heat sink attached by a heat plate available in the prior art.
Figure 2:
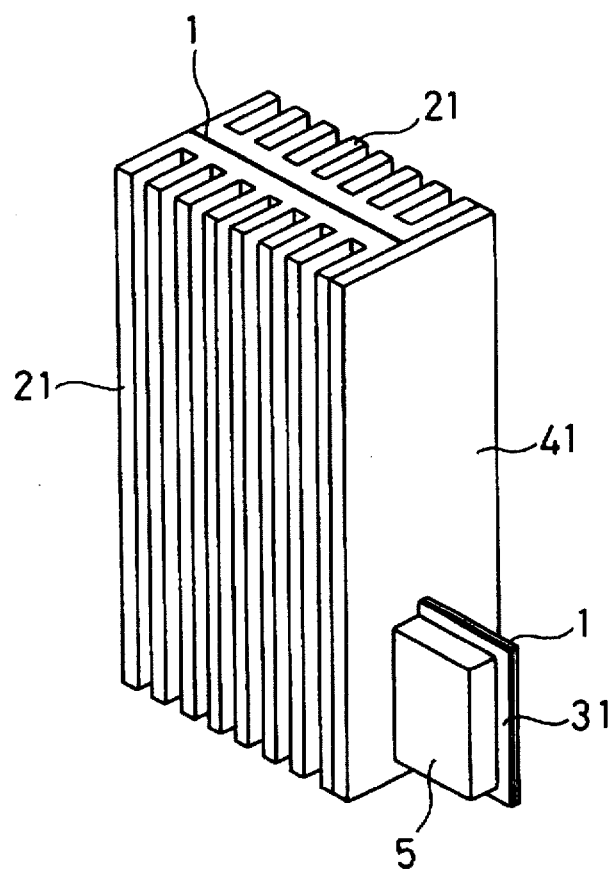
FIG. 2 is an assembled perspective view of a heat sink attached to a heat plate available in the prior art.

Referring to the drawings, a heat sink attached to a heat plate in accordance with one embodiment of this invention will be described below.

Figure 3:
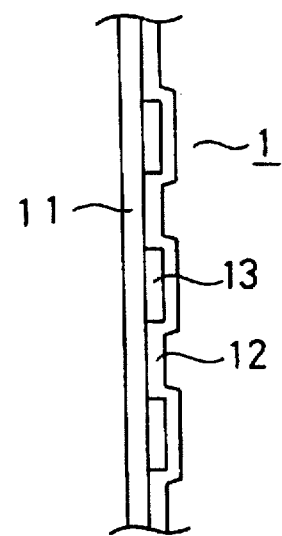
FIG. 3 is a cross-sectional view of a heat plate employed for a heat sink attached to a heat plate in accordance with one embodiment of this invention.

Referring to FIG. 3, a heat plate 1 consists of two aluminum plates 11 and 12, which are stuck to each other. The surface of the aluminum plate 11 on which surface a cooling fin 2 is to be stuck is made even and the surface of the other aluminum plate 12 is allowed to be uneven. A path for a heat exchange medium 13 exists between the two aluminum plates 11 and 12 at a location corresponding to the projection caused by the path for the heat exchange medium 13. The heat plate 1 having the foregoing cross-section can be readily produced by employing the steps described below. Two aluminum plates 11 and 12 are piled on a table having a flat surface. A fluid is forced with high pressure between the two aluminum plates 11 and 12 at the region at which a path for a heat exchange medium 13 is to be produced, while the surface of the aluminum plate 12 is being pressed with high pressure on the region at which a path for a heat exchange medium 13 is not produced. In this manner, a path for a heat exchange medium 13 is inflated with a fluid.

Figure 4:
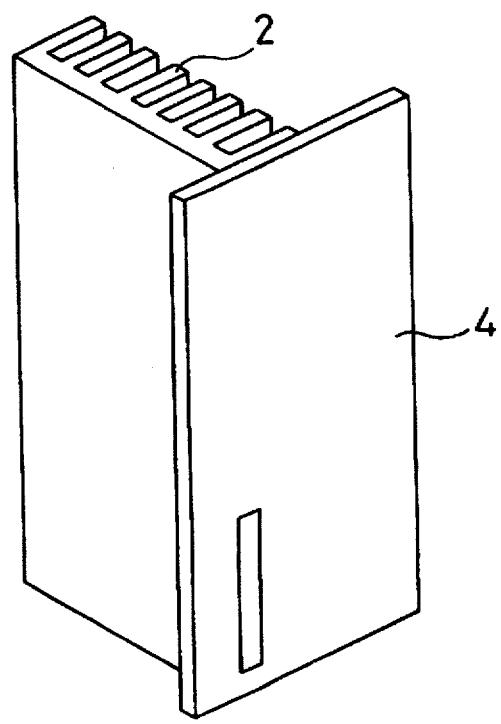
FIG. 4 is a perspective view of the assembly of a cooling fin and a flange employed for a heat sink attached to a heat plate in accordance with one embodiment of this invention, which assembly is fabricated by employing a die casting process.

Referring to FIG. 4, a die casting process is conducted to fabricate the assembly of a cooling fin 2 and a flange 4. Since the assembly of the cooling fin 2 and the flange 4 are fabricated in one body, the number of the parts to be employed for production thereof is reduced.

Figure 5:
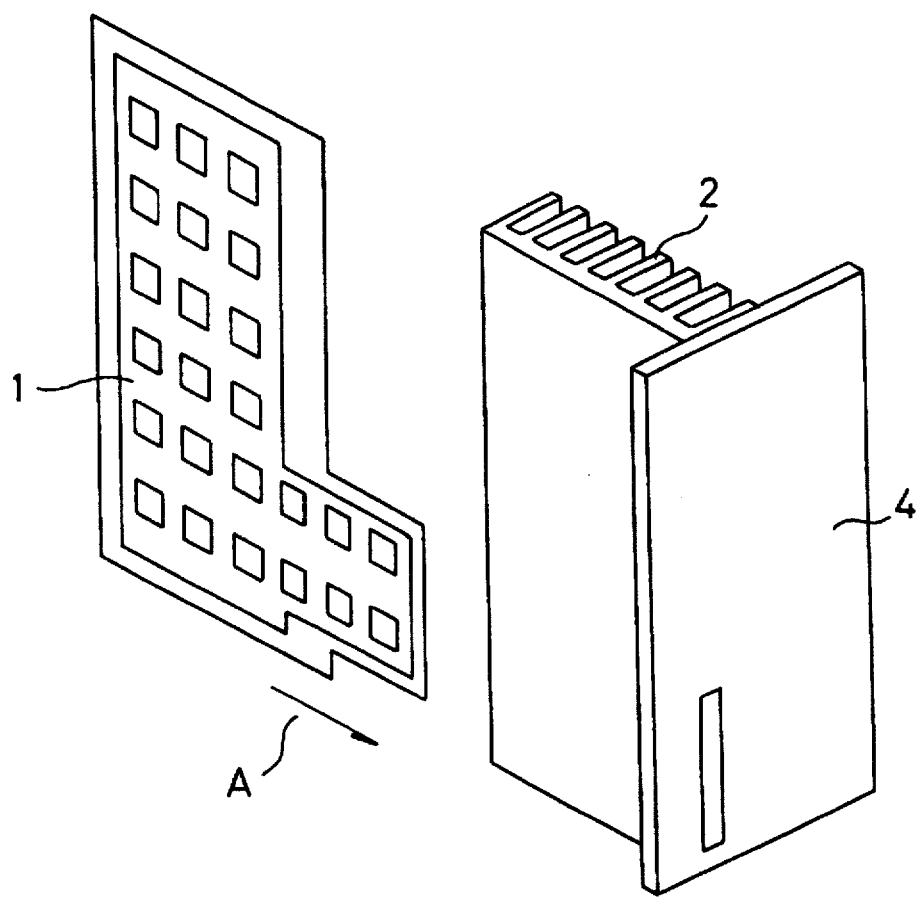
FIG. 5 is a broken perspective view of a heat sink attached to a heat plate in accordance with one embodiment of this invention.

Referring to FIG. 5, the heat plate 1 is assembled into the assembly of a cooling fin 2 and a flange 4, as illustrated by an arrow A. Since one surface (the rear surface in the drawing) of the heat plate 1 is an even plane, the heat plate 1 can be attached fast with screws, an adhesive or the like, without employing an aluminum soldering process.

Figure 6:
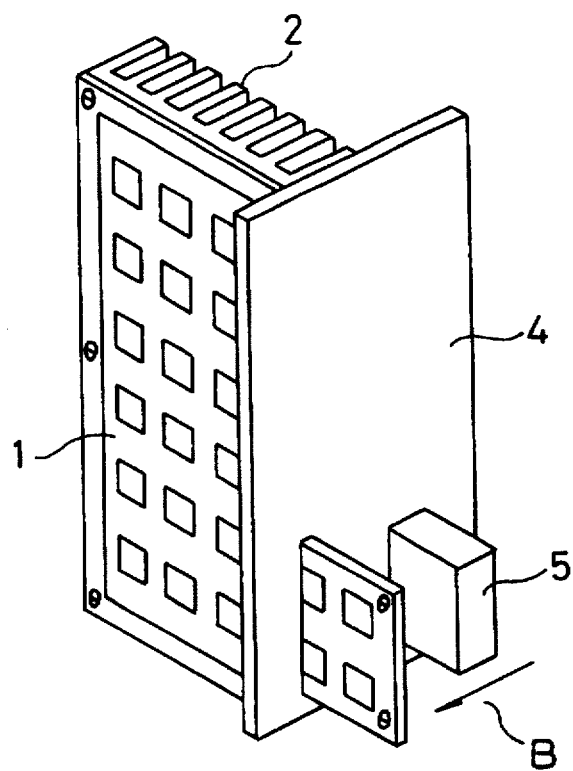
FIG. 6 is an assembled perspective view of a heat sink attached to a heat plate in accordance with one embodiment of this invention.

Referring to FIG. 6, an object to be cooled 5 can be fitted on one surface (the rear surface in the drawing) of the heat plate 1 with screws, an adhesive or the like, in the direction of an arrow B. Since the surface (the rear surface in the drawing) of the heat plate 1 on which surface the object to be cooled 5 is attached, is an even plane, the heat transmission plate 31 is unnecessary, though the heat transmission plate 31 is essential in the prior art. In this manner, the number of parts to be employed for production thereof is reduced.

As was described above, the surface of the heat plate employed for a heat sink attached by a heat plate in accordance with this invention, on which surface a cooling fin 2 is stuck, is an even plane. Therefore, employment of an aluminum soldering process is unnecessary in the entire process for fabrication of the heat sink attached by a heat plate in accordance with this invention. A cooling fin 2 and a flange 4 are fabricated in one body by employing a die casting process. Therefore, the number of the parts to be employed for production thereof is reduced, and the assembly process is made short and simple. As a result, the production cost of the heat sink attached by a heat plate in accordance with this invention is considerably less than that of the prior art.

POSSIBILITY TO EMPLOY THIS INVENTION FOR THE INDUSTRIAL PURPOSES

As was described above, a heat sink attached to heat plate in accordance with this invention requires less number of parts to be employed for production thereof and a shorter and less complicated fabrication process, and does not require an aluminum soldering process in the entire process for production thereof. Therefore, the heat plate in accordance with this invention is definitely useful for cooling articles, such as semiconductor devices, or the like, which are usually mounted in cubicles or the like.

What is claimed is:

1. A heat sink assembly comprising:

a heat plate structure comprising first and second aluminum plates, each having attachment surfaces, said first and second aluminum plates being attached to each other with said attachment surfaces thereof in contacting relationship, said first aluminum plate having an entire planar surface opposite said attachment surface of said first aluminum plate, and wherein said attachment surface of said first aluminum plate has an entire planar surface, at least one of said plates being configured to provide a closed path for confining a heat exchange medium located between said first and second aluminum plates to bring said heat exchange medium into contact with each of said first and second aluminum plates during circulation of said heat exchange medium, said path being oriented so that said heat exchange medium circulates therethrough in a vertical direction between said first and second aluminum plates; and a one-piece structure comprising a cooling fin and a flange, said cooling fin having an entire surface directly attached to a portion of said planar surface of said first aluminum plate so that another portion of said planar surface remains available for direct attachment to an entire surface of an object to be cooled;

whereby said cooling fin and said object to be cooled are directly attached by screws to said planar surface of said first aluminum plate.

2. A heat sink attached to a heat plate according to claim 1, wherein said flange has a slot for receiving said another portion of said heat plate.

* * * * *